US007098676B2

(12) United States Patent
Landers et al.

(10) Patent No.: US 7,098,676 B2
(45) Date of Patent: Aug. 29, 2006

(54) MULTI-FUNCTIONAL STRUCTURE FOR ENHANCED CHIP MANUFACTURIBILITY AND RELIABILITY FOR LOW K DIELECTRICS SEMICONDUCTORS AND A CRACKSTOP INTEGRITY SCREEN AND MONITOR

(75) Inventors: William F. Landers, Wappingers Falls, NY (US); Thomas M. Shaw, Peekskill, NY (US); Diana Llera-Hurlburt, Fishkill, NY (US); Scott W. Crowder, Ossining, NY (US); Vincent J. McGahay, Poughkeepsie, NY (US); Sandra G. Malhotra, Beacon, NY (US); Charles R. Davis, Fishkill, NY (US); Ronald D. Goldblatt, Yorktown Heights, NY (US); Brett H. Engel, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 305 days.

(21) Appl. No.: 10/338,931

(22) Filed: Jan. 8, 2003

(65) Prior Publication Data

US 2004/0129938 A1    Jul. 8, 2004

(51) Int. Cl.
*G01R 27/08* (2006.01)
*G01R 31/26* (2006.01)
*H01L 31/07* (2006.01)
*H01L 23/58* (2006.01)

(52) U.S. Cl. .................. 324/716; 324/765; 257/486; 257/635

(58) Field of Classification Search ............... 324/719, 324/765–766, 158.1, 716; 257/73, 486, 629, 257/631, 635; 438/14–18
See application file for complete search history.

(56) References Cited

U.S. PATENT DOCUMENTS

| 5,530,280 | A |   | 6/1996  | White ..................... 257/508     |
|-----------|---|---|---------|----------------------------------------|
| 5,786,705 | A | * | 7/1998  | Bui et al. ................. 324/766   |
| 6,091,131 | A |   | 7/2000  | Cook et al. ................ 257/629   |
| 6,261,945 | B1| * | 7/2001  | Nye et al. .................. 438/633  |
| 6,326,297 | B1| * | 12/2001 | Vijayendran ............... 438/627     |
| 6,403,389 | B1| * | 6/2002  | Chang et al. ................ 438/18    |
| 6,621,290 | B1| * | 9/2003  | Marathe et al. ............. 324/766    |
| 6,633,083 | B1| * | 10/2003 | Woo et al. .................. 257/751   |

OTHER PUBLICATIONS

Toa et al., "Electromigration Characteristics of TiN Barrier Layer Material", Jun. 1995 IEEE Electron Device Letters, vol. 16, No. 6. p. 230-232.*

* cited by examiner

*Primary Examiner*—Anjan Deb
*Assistant Examiner*—Jeff Natalini
(74) *Attorney, Agent, or Firm*—Lisa J. Ulrich

(57) ABSTRACT

An on-chip redundant crack termination barrier structure, or crackstop, provides a barrier for preventing defects, cracks, delaminations, and moisture/oxidation contaminants from reaching active circuit regions. Conductive materials in the barrier structure design permits wiring the barriers out to contact pads and device pins for coupling a monitor device to the chip for monitoring barrier integrity.

12 Claims, 12 Drawing Sheets

SERPENTINE CRACK STOP (Top Down)

MULTI-FUNCTIONAL STRUCTURE FOR ENHANCED CHIP MANUFACTURIBILITY AND RELIABILITY FOR LOW K DIELECTRICS SEMICONDUCTORS AND A CRACKSTOP INTEGRITY SCREEN AND MONITOR

BACKGROUND OF THE INVENTION

Technical Field of the Invention

This invention pertains to barriers formed in IC chips near the chip edge for preventing the propagation of cracks, typically initiated by a chip dicing operation, and the migration of contaminants through those cracks. The present invention also pertains to monitoring the integrity of these chip barriers. In particular, this invention provides an improved barrier apparatus, and an apparatus for verifying barrier integrity by detecting reliability failures.

Low-k dielectric technologies are particularly susceptible to mechanical damage resulting from chip dicing. Although a dual sacrificial crackstop is currently designed into many IC chips, if this is breached oxidation and other humidity related failures can ensue. A signature of these types of failures is leakage between adjacent circuits, e.g. shorts, and changes in measured capacitance. We propose that a monitor circuit be designed into chip products to detect crackstop integrity as well as alerting users to this type of failure before catastrophic failure occurs.

Mechanical damage as a result of wafer final finishing or module build that reaches an unprotected moisture/oxidation barrier for a low-k dielectric semiconductor can result in a chip field failure. The present invention comprises dual pyramidal moisture/oxidation barriers with an additional structure acting as a physical crackstop (see FIG. 2 below). This design also utilizes the crack termination properties of a polyimide surface coating lying between the moisture/oxidation barriers and the crackstop.

SUMMARY OF THE INVENTION

This invention comprises a novel barrier structure for an IC chip along with structure for allowing field monitoring for testing the integrity of the barrier structure. The IC chip includes an active circuit area at least partially surrounded by at least one crackstop mechanical barrier for preventing the propagation of delaminating chip layers as well as other structural cracks and defects into the active circuit area. Typically, though not exclusively, defects originate from a chip dicing operation which forms damaged chip edges. Although barriers formed several layers deep are necessary to prevent crack propagation, a top surface deposition of a material such as polyimide has been shown to stop delamination. Other barriers can also include those whose structural characteristics better shield against moisture and oxidation compared with a typical crackstop structure. Still other barriers are designed for providing crackstop protection as well as allowing electrical coupling to a monitoring device for testing the capacitance and/or resistance of the barrier structure which would indicate to a user the status of the barrier's integrity. A barrier breached by a crack or moisture/oxidation will demonstrate deviations in capacitance and/or resistance.

Any of the barrier structures can also be used in a portion of the chip, for example, at least partially surrounding a circuit region that is susceptible to mechanical stresses that might damage the integrity of the chip structure and disable the chip circuits. Using all the these techniques simultaneously for stopping defect propagation on a single IC ship is also part of the present invention.

Multiple barrier regions on one chip may be designed for moisture/oxidation blockage and for mechanical crackstop purposes. The barriers are comprised of alternating layers of a dielectric material and a metal. The metal layers are electrically coupled by vias through the dielectric layers. Those barriers having a plurality of vias in their dielectric layers, exhibit better moisture/oxidation protection than those implementing only one via in their dielectric layers. The crackstop barriers illustrated herein comprise a single via structure. Any number of these different types of barriers may be combined on a single IC chip.

It is an object of the invention to provide an improved crackstop and contaminant barrier for IC chips, wherein multiple barriers are combined on one IC chip. It is another object of the invention to provide an improved moisture/oxidation barrier for IC chips utilizing low-K dielectric insulation materials. It is another object of the present invention to provide a means for monitoring the integrity of dual crackstop structures in order to provide early detection of active failure mechanisms occurring in an IC chip.

Other features and advantages of this invention will become apparent from the following detailed description of the presently preferred embodiment of the invention, taken in conjunction with the accompanying drawings.

BEST MODE FOR CARRYING OUT THE INVENTION

Figure 1:
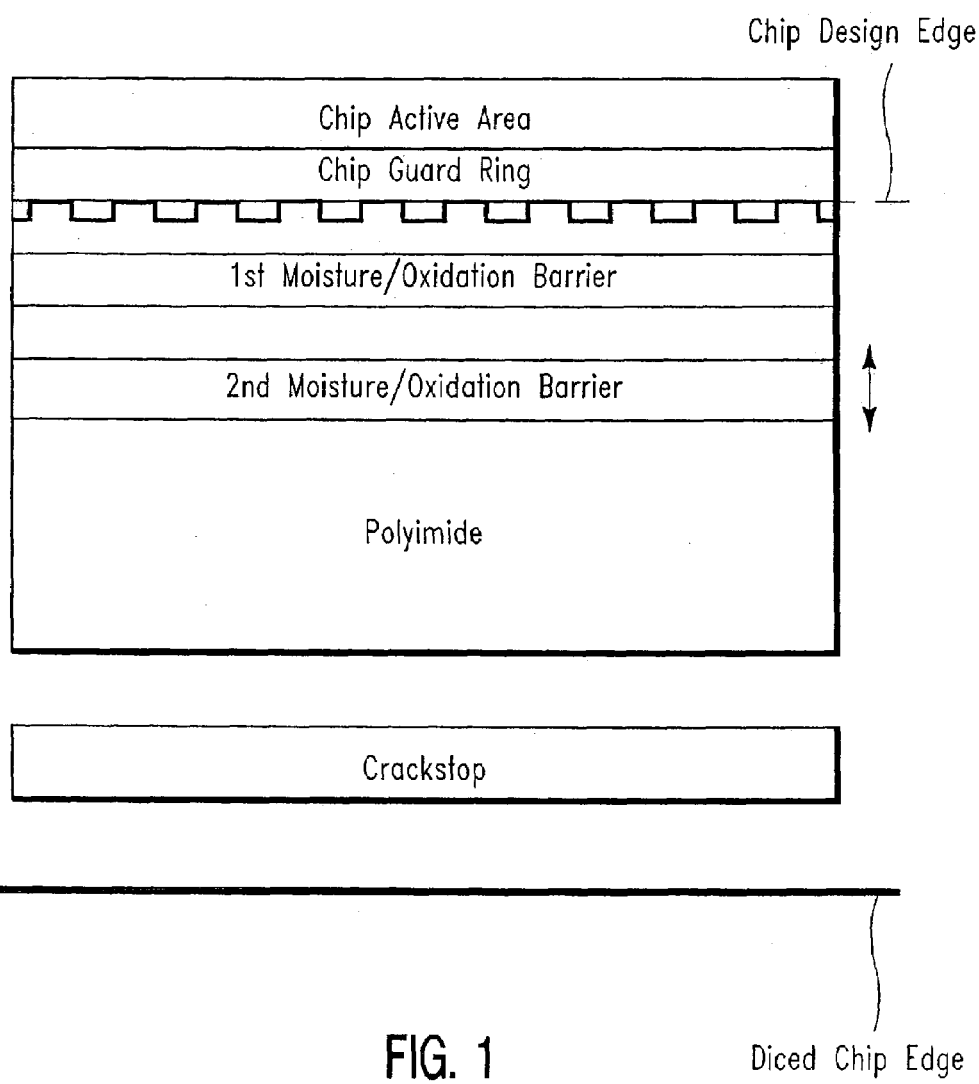
FIG. 1 illustrates various barriers between an IC chip edge and an active circuit region on the IC chip.

With reference to FIG. 1, there is illustrated an exemplary depiction of various barrier contours existing in the novel chip embodiment of the present invention. Beginning at a diced edge of an IC chip and moving inward toward a chip active circuit region, there is illustrated in sequence: a crackstop formed in the chip substrate, a polyimide layer typically on the chip's top surface, two oxidation/moisture barriers formed in the chip substrate, and, finally, a guard ring disposed adjacent to the chip's active circuit region, also formed in the chip substrate.

Figure 2:
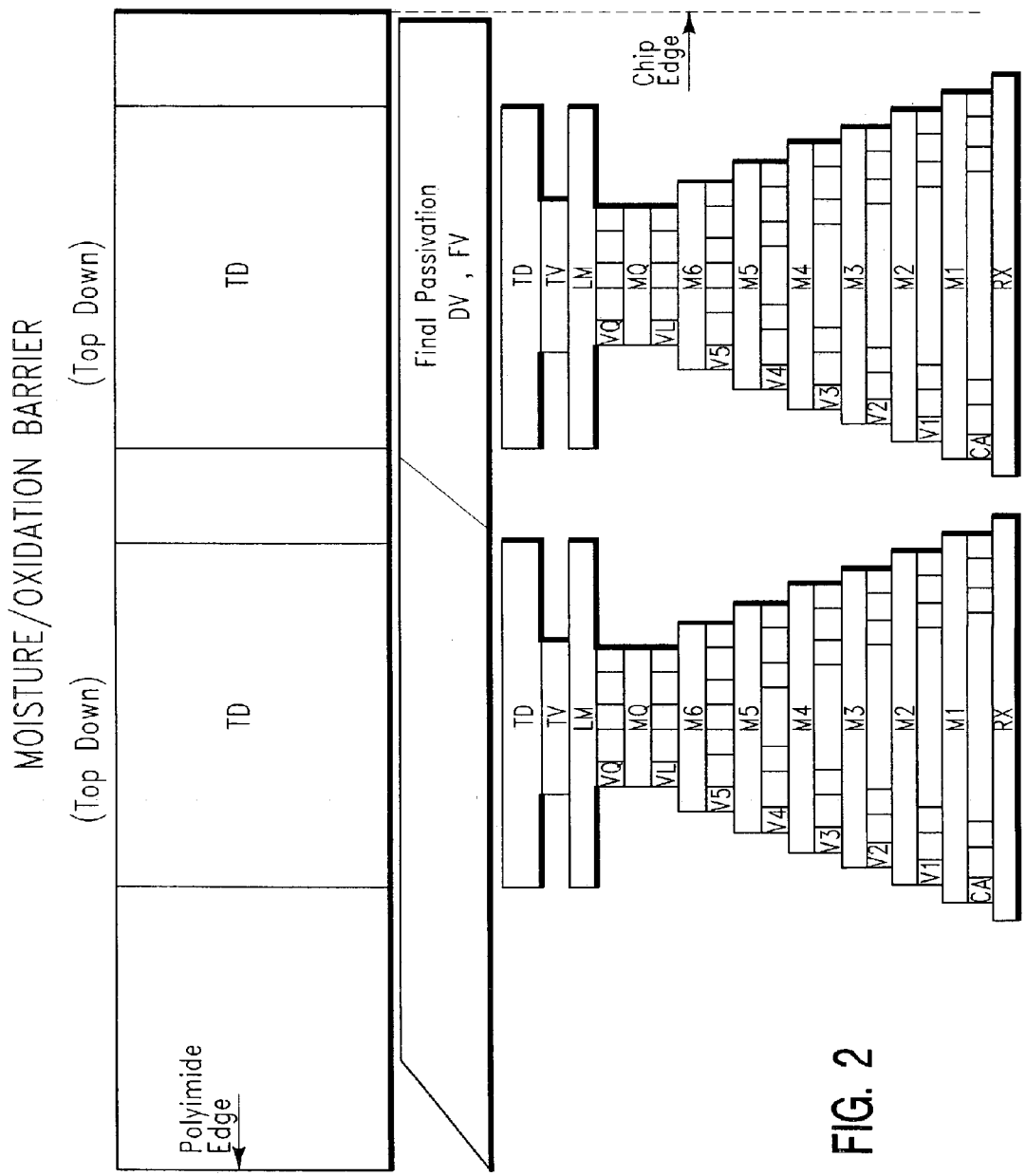
FIG. 2 illustrates close-up top and cross section views of some of the various barriers shown in FIG. 1.
Figure 2A:
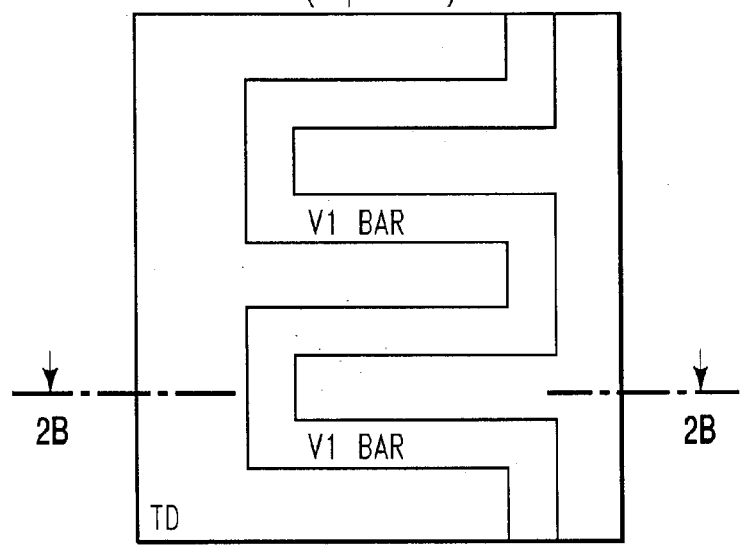
Figure 2B:
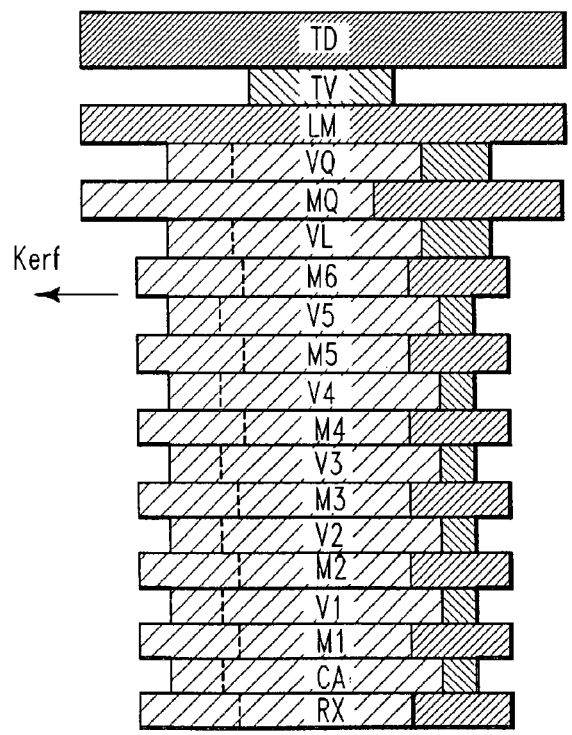
Figure 11:
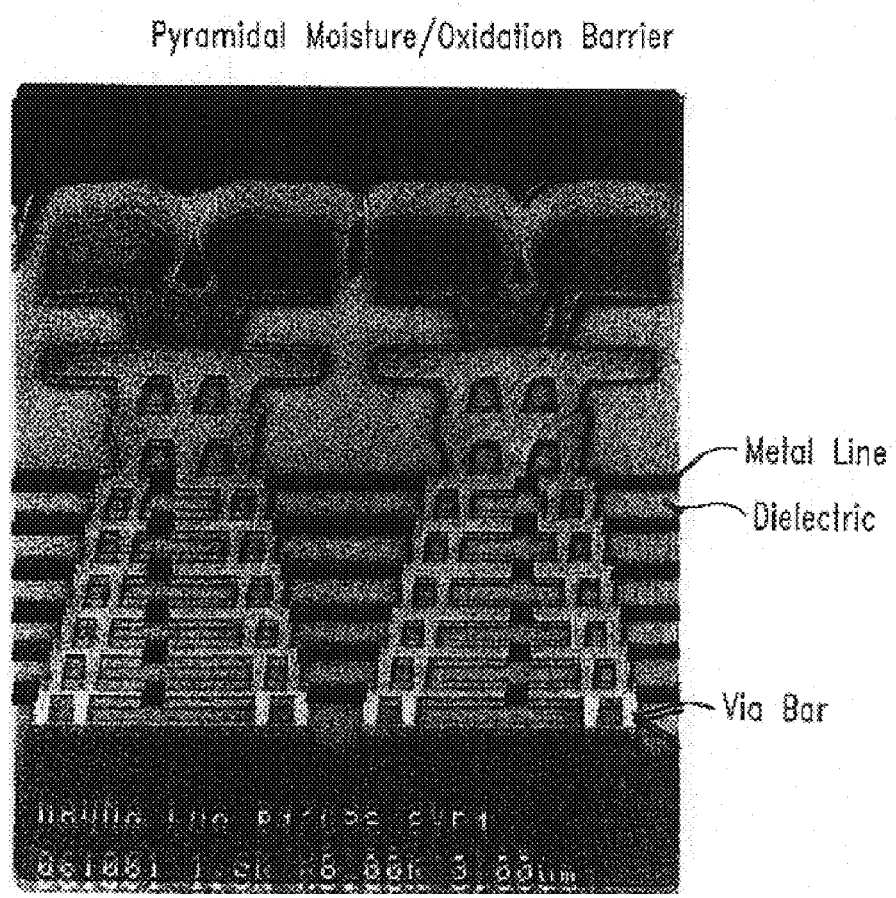
FIG. 11 illustrates a micrograph cross section of a pair of moisture/oxidation barriers as shown in FIG. 2.
Figure 12:
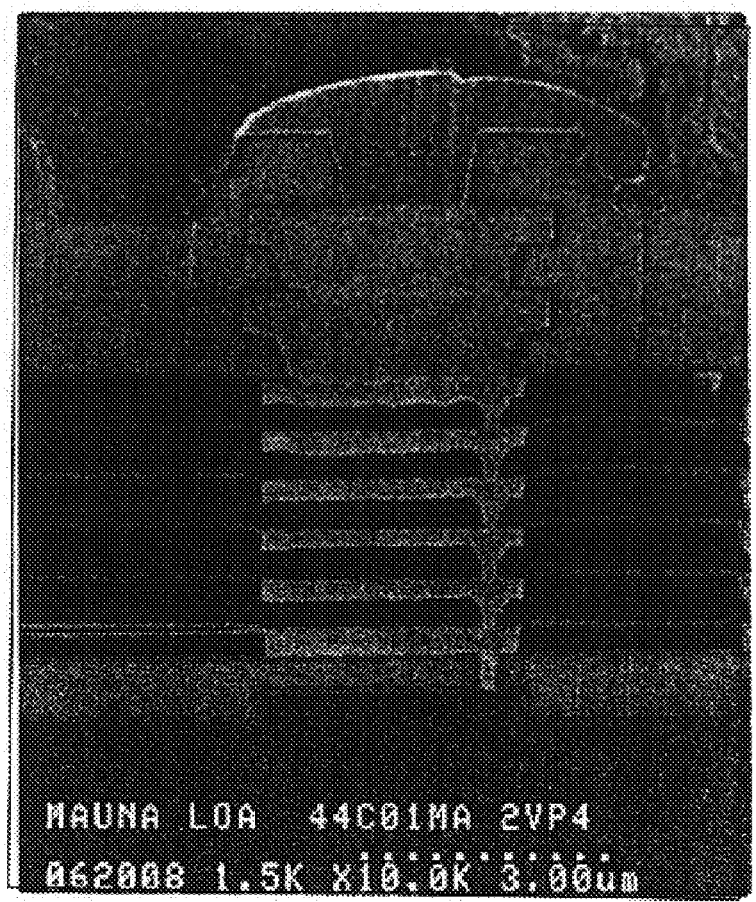
FIG. 12 illustrates a micrograph cross section of a crackstop as shown in FIG. 2.

With reference to FIG. 2 (not drawn to scale), a top view is shown with a corresponding cross section view below. In the cross section view, there is illustrated the layered substrate structure of the fabricated barriers. Actual micrographs of the moisture/oxidatiaon barriers and mechanical crackstop are illustrated in FIGS. 11 and 12, respectively. The layers of the barriers include alternating layers of metal, labeled M1 ... Mn, and insulator material, shown as white space including the space in between the moisture/oxidation barrier structures and the mechanical crackstop. Vias, which electrically couple metal layers through the insulator layer are labeled V1 ... Vn. Metal and dielectric layers near the top or bottom of the stack are labeled according to their mask designation.

These barrier layers correspond to the deposited metal layers and interlevel dielectric used in the chip active device areas. The layers are each typically formed over the entire chip during a single deposition, or spin-on, step. Hence, the metal layer M1, for example, is deposited over the entire chip and is defined by mask layers in the chip active area to form a first level device interconnect pattern in the active area. Within the barriers depicted in the figure, these metal layers are used to form the crackstop structure and moisture/oxidation barriers, utilizing appropriate mask patterns.

Figure 10:
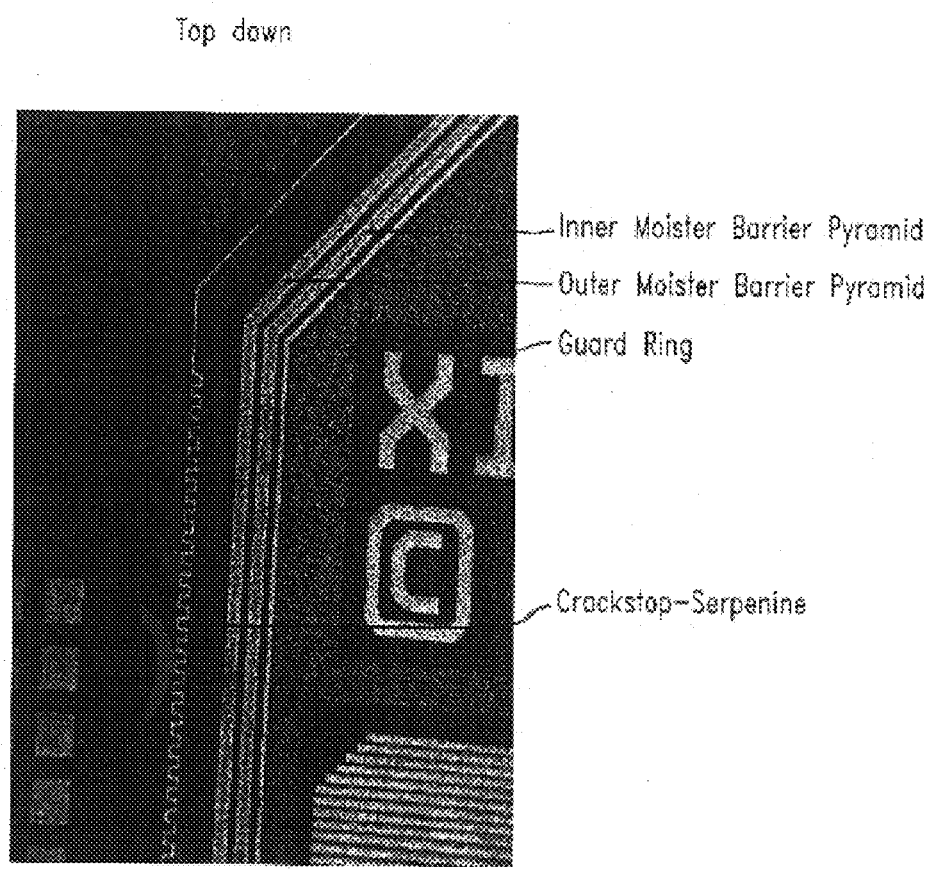
FIG. 10 illustrates an example micrograph serpentine crackstop and other barriers on an IC chip.

FIG. 2 also shows, in the upper left portion, a close up serpentine path of the crackstop, with a cross section view below that. A micrograph of the serpentine crackstop geometry is shown in FIG. 10. Similar to the metal layers, the dielectric layers formed between the metal layers are deposited across the chip surface, acting as interlevel dielectric between metal levels in the active chip region and as "fill" in the spaces between the crackstop and moisture/oxidation barriers shown in the figure. The fill insulator materials are not shown layered in the figure, however, the upper layers of dielectric may comprise fluorinated and unfluorinated silica glass (FSG or USG), or oxide fill, while the lower layers may comprise a low-k dielectric. Such a dielectric material is a well known article of commerce, such as the trade brand SiLK, manufactured and sold by E.I. Dupont de Nemours, Inc., and is not described further. Low-k material is known to permit oxygen to readily flow through it, and the moisture/oxidation barrier serves to block the inward oxygen flow. Copper is especially susceptible to oxidation damage, breakdown and deterioration. It is also optional to use any single one of these dielectric materials as fill between the barrier structures shown in FIG. 2. These chip fabrication processes utilizing metal layers and interlevel dielectric are well known in the art and are not part of the present invention and so are not further discussed in detail here.

The pyramidal moisture/oxidation barriers utilize a plurality of metal vias to connect the metal layers through the dielectric layer. This provides additional protection from moisture/oxidation contamination as compared to the crackstop structure which typically utilizes one interlevel via, although both structures provide some protection against propagation of cracks and moisture/oxidation contamination. In either instance, the vias provide a continuous electrical circuit from the top layer of metal down to the lowest metal layer. The several lower layers of dielectric may utilize a low dielectric constant material (low-k) such as SiLK (TM), while the upper layers may utilize conventional oxide layers, which is stiffer than the low-K material. The white space between the barrier structures illustrates regions filled with insulating layers. Many companies now include an all low-k dielectric fill in their product plans, thus, the present embodiments also apply to those IC chips utilizing only low-k fill, solely oxide, and solely glass fill. The metal layers may be comprised of aluminum or copper, although the presently preferred embodiment is copper.

Figure 8:
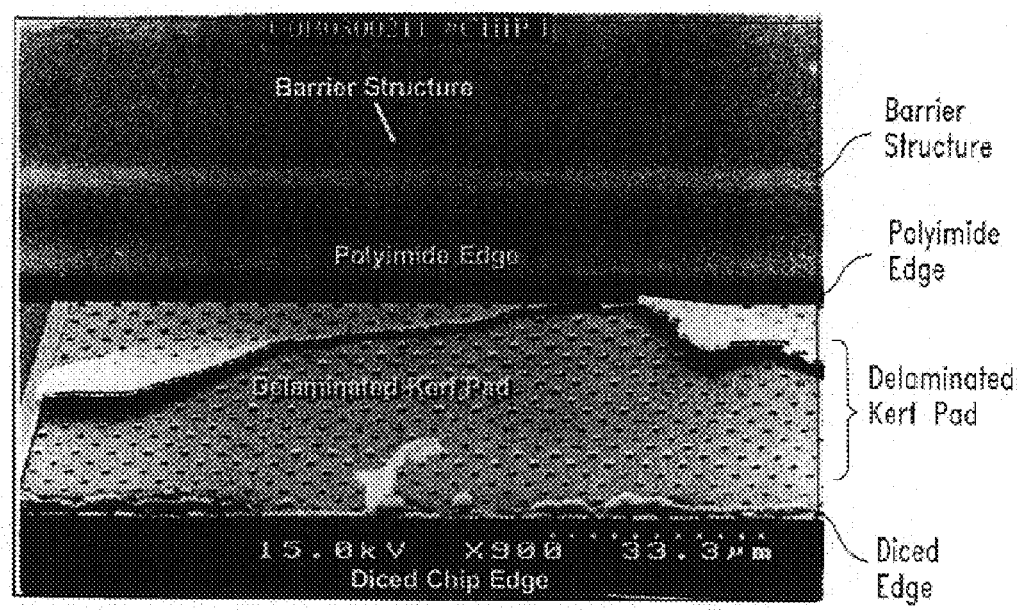
FIG. 8 illustrates a micrograph perspective view of a chip edge delamination being attenuated by a polyimide chip surface layer.
Figure 9:
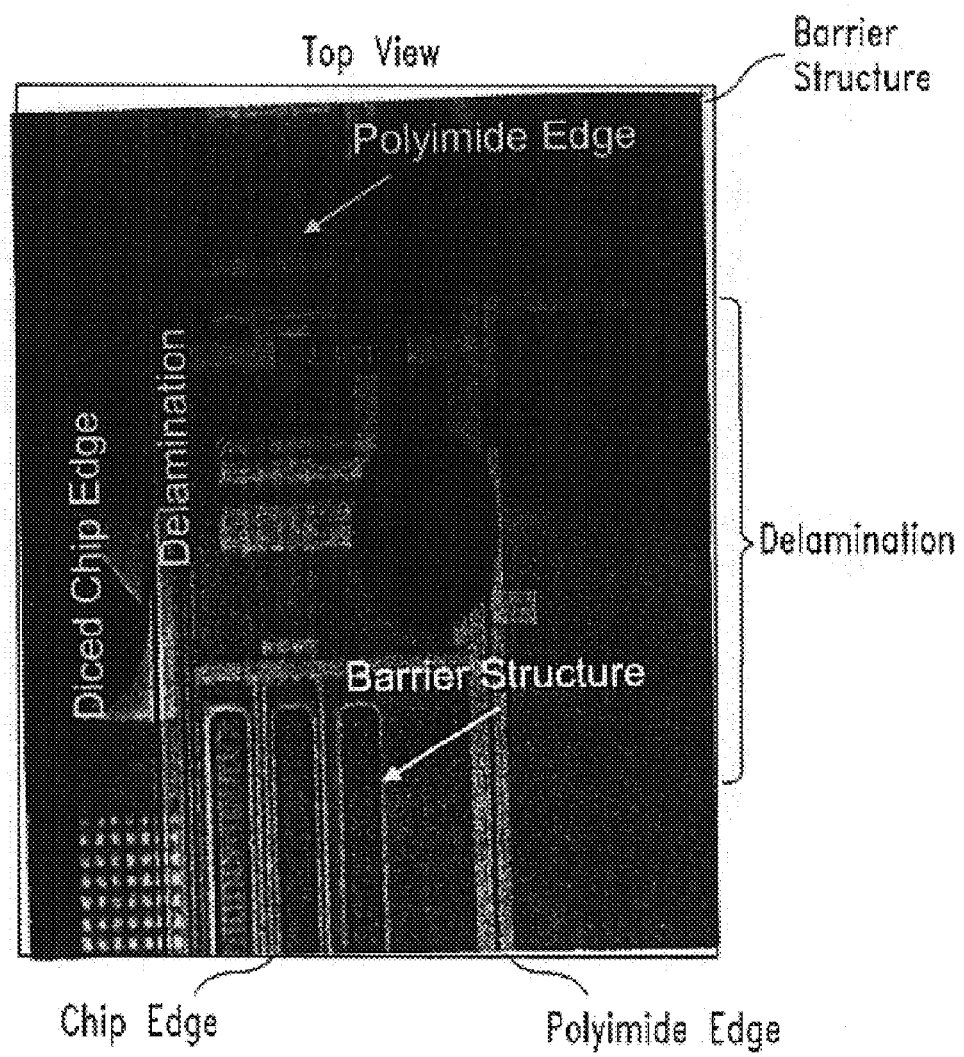
FIG. 9 illustrates a micrograph top view of a diced chip edge delamination being attenuated by a polyimide chip surface layer.

A top surface passivation layer comprising polyimide extends from the active circuit area and terminates in between the final two barriers, as shown in FIG. 2. The polyimide layer prevents delamination, or separation, of chip layers from spreading toward the active chip area. FIGS. 8 and 9 show actual micrographs of the polyimide layer effectively terminating the chip edge delamination.

Figure 3:
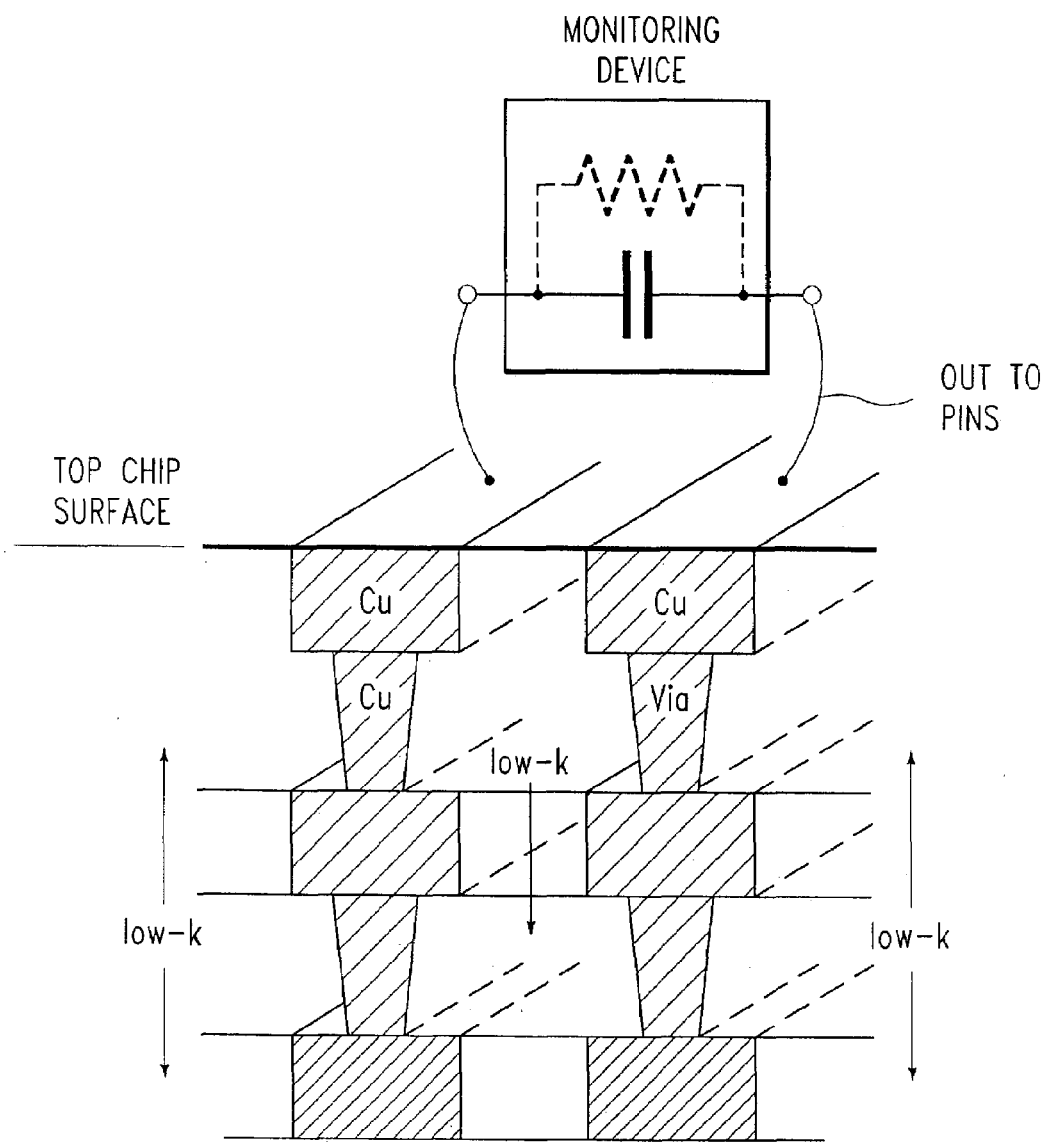
FIG. 3 illustrates an example double barrier structure coupled to a monitoring device.

Referring to FIG. 3, there is shown a dual barrier structure, comparable to those shown in FIG. 2 but fabricated in a "single column" structure, which is useful, as are the barrier structures shown in FIG. 2, for coupling to a monitoring device, such as a capacitance meter, for detecting early failure of the dual barrier. The barrier structures of FIG. 2 or the single column embodiment of FIG. 3 comprise via levels that electrically couple the metal layers of the barriers resulting in a continues electrical path from the top metal layer down to the bottom metal layer. Failure of the dual barrier can be caused by spreading layer delaminations, separations, or cracks. If the barrier structure fails to attenuate propagation of the crack, whereby the crack passes through the barrier itself, the resulting integrity failure will detectibly affect the electrical properties of the barrier. This effect can be monitored and detected by coupling a capacitance meter, or an ohmmeter (resistance) meter, to the barrier and measuring the magnitude of the capacitance and/or resistance. A deviation from an expected value or from a previously measured value indicates breach of the barrier, as explained below. Typically, capacitance and resistance will drop if the delamination causes a short between two barrier structures. Oxidation and moisture contamination can also produce the shorted connection between the columns. Layer separation in portions of the barrier structure will also affect the electrical characteristics as measured by a monitor device.

In the manner explained above, a baseline capacitance can be measured between the two structures. The initial measurement can be used in two ways. First, it can be used as a screen to check if the crack stop is continuous. The chip can be exposed to moisture, and the capacitance can be remeasured. If there had been a noticeable change in capacitance, e.g. a drop in capacitance, it is likely that the crackstops have not been built properly. Additionally, this same principle can be applied to the chip once it goes into service. If a constant monitor notices an appreciable change in the capacitance between the crackstops over time, it will alert the user that a potential problem is immanent (before catastrophic failure). Such an implementation can include dedicated pins extending from the chip that are accessible to system side monitoring software which would carry out the test on an automated basis. Other implementations include manually coupling of a capacitance meter to the chip.

The crackstop layers are made of copper and low-k material and are continuations of the chip circuitry layers. Although the crackstop masking is standard on chip layout masks, presently these are not accessible via wiring. The example dual barrier shown in the figure comprises copper metal layers alternating with copper via structures to form an electrically conductive single column barrier several layers deep that is formed in the chip substrate at least partially surrounding the chip active area or selected circuit regions on a chip.

Figure 4A:
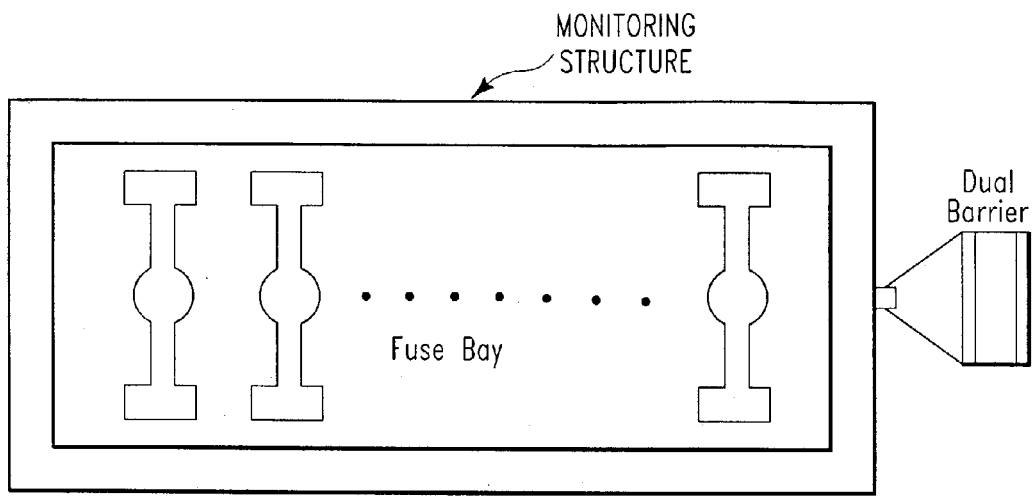
FIG. 4 illustrates an example fuse bay and its approximate example location on a diced IC chip.
Figure 4B:
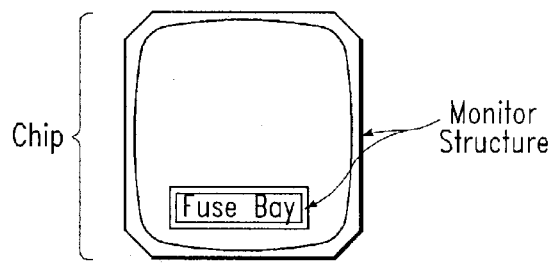

Referring to FIG. 4, there is shown an example region of the IC chip wherein electrical circuits, for example, a fuse bay comprising a plurality of fusible circuits selectively blown by laser ablation, are processed in a manner that may stress the surrounding chip substrate causing defects in the structure which may propagate towards other areas in the active circuit region. The monitor structure, comprising a dual barrier arrangement as described herein, can also be used to at least partially surround this area in order to provide early detection of a possible substrate breach by coupling a monitoring device to the dual barrier. FIG. 4 illustrates an example location on an IC chip wherein the fuse bay may be disposed, and at least partially surrounded by the crackstop and monitor structure.

Figure 5:
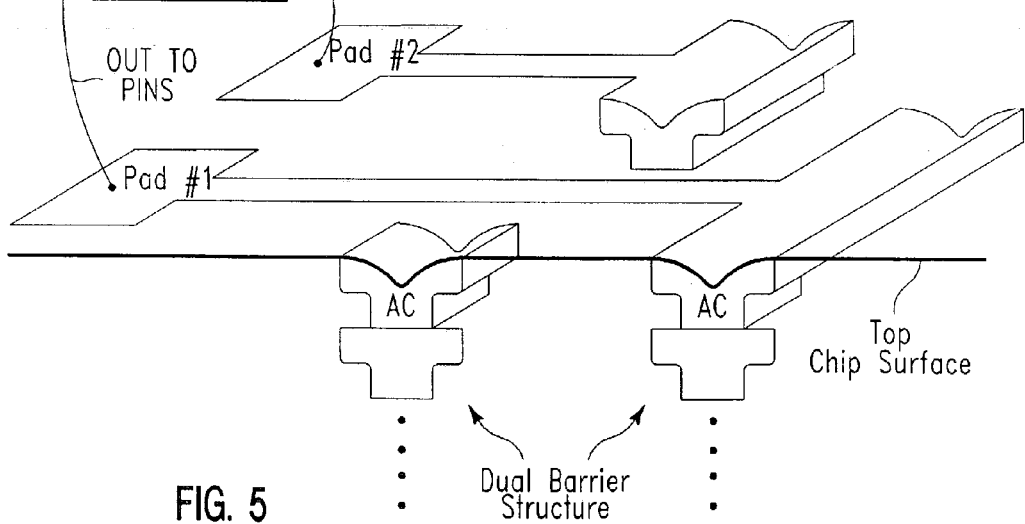
FIG. 5 illustrates an example wiring of a double barrier to contact pads on the surface of the IC chip.

Referring to FIG. 5, there is illustrated another example embodiment for wiring the dual barrier structures out to contact pads. The contact pads, in turn, are coupled to device pins in the chip package, providing accessible contact points for a monitor device to measure electrical characteristics of the barrier structure. As shown in FIG. 5, the topmost metal layers of the barrier structure are wired out to bond pads for use by a monitoring device to measure electrical characteristics of the barrier structure. The processing steps for contacting pads to chip wires is well known in the chip processing field and is not described further.

Figure 7:
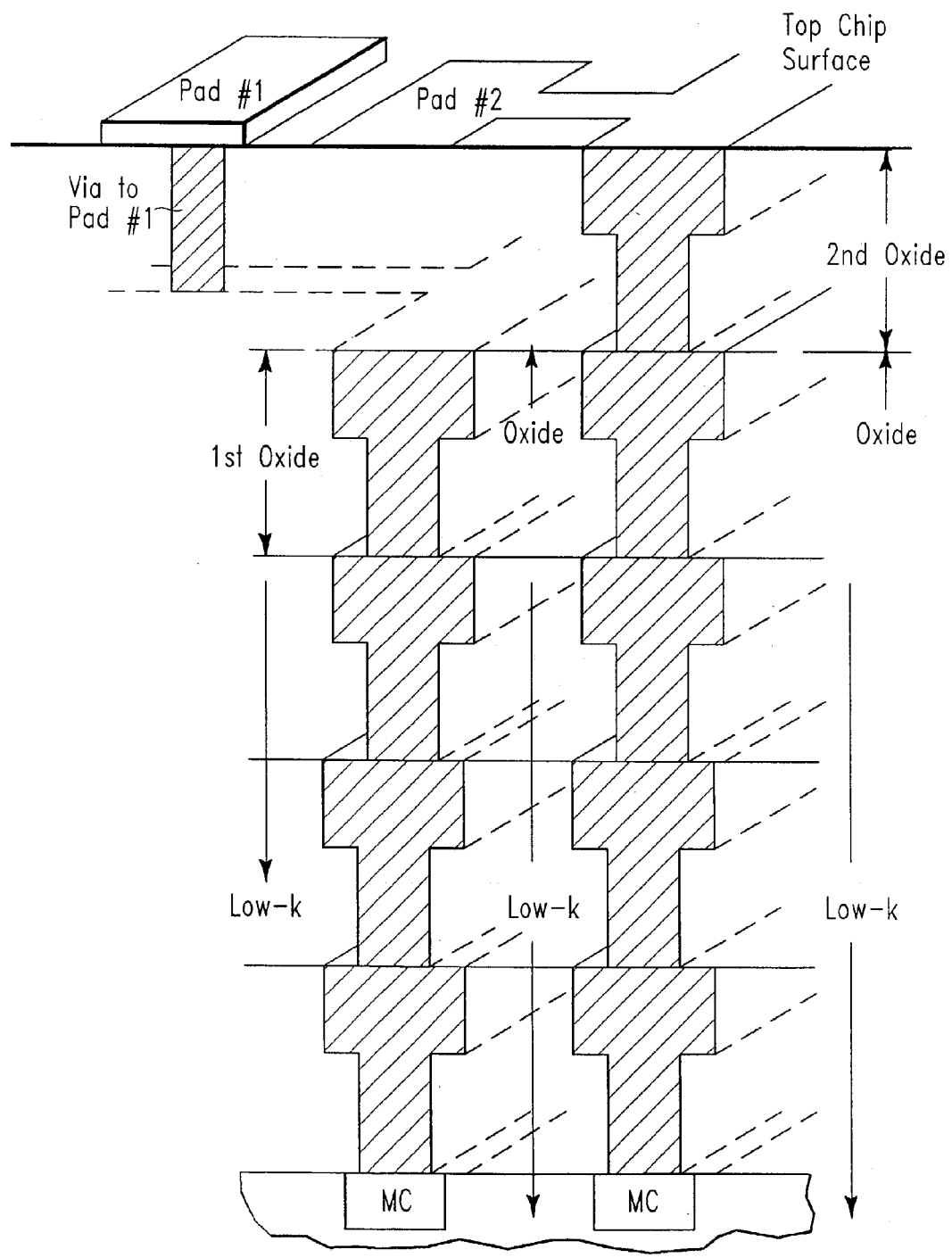
FIG. 7 illustrates another example wiring of the inventive double barrier to contact pads on the surface of the IC chip.

The wiring example in FIG. 5 can also be used to electrically couple the topmost metal layers of the moisture/oxidation barriers and crackstop barriers, shown in FIG. 2, to pads for providing access to a monitoring device. As shown in FIG. 5, one of the top layer metal lines is discontinuous to permit the pad wiring of the other line. Another embodiment for wiring these barrier structures out to contact pads is shown in FIG. 7, wherein one of the barrier structures is extended laterally in a layer below the topmost wiring layer. This lateral extension is then coupled to an upper wiring layer, or pad, through a via.

Figure 6:
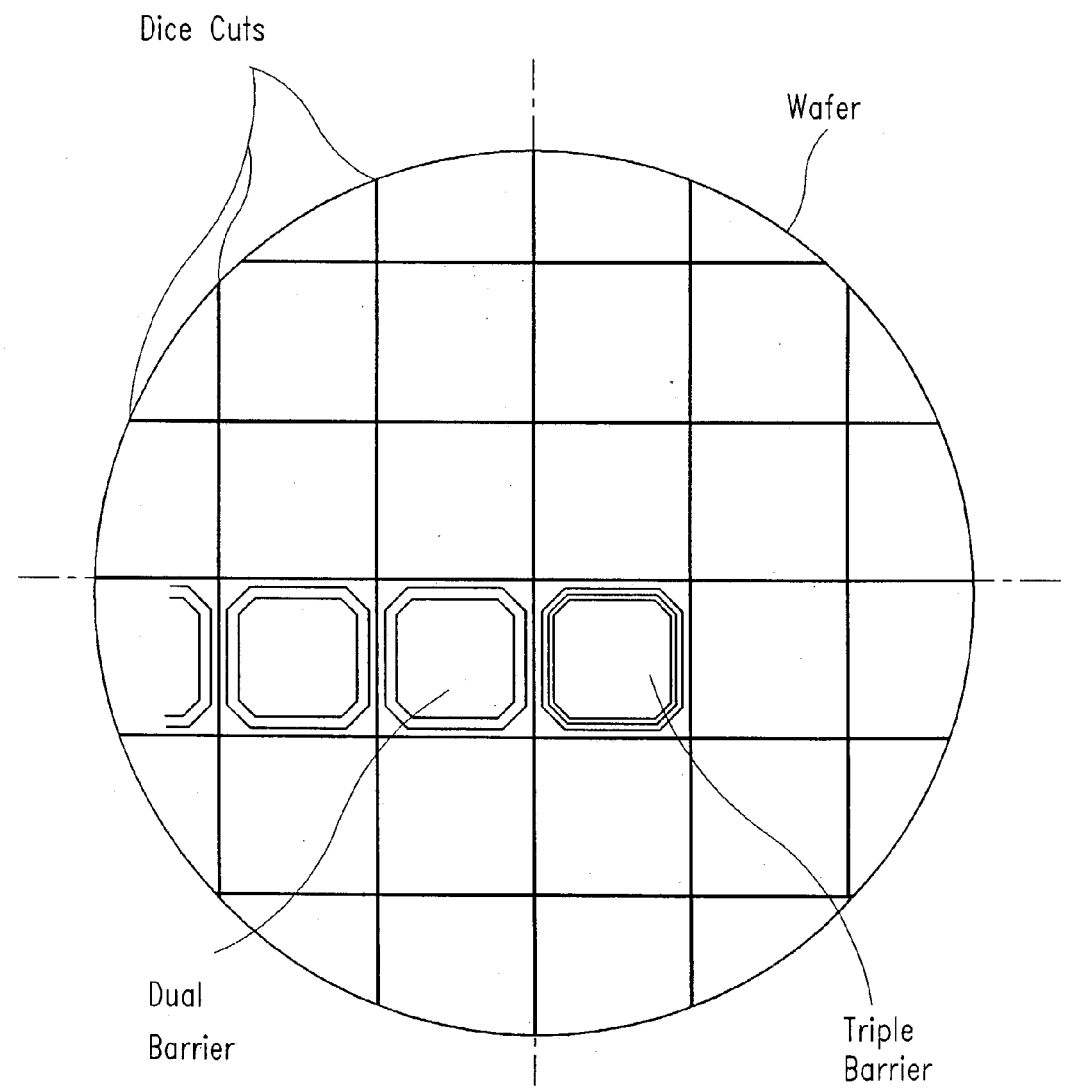
FIG. 6 illustrates a top view of a diced wafer showing approximate locations of crackstop and other barriers on example chips.

Referring to FIG. 6, an example wafer is illustrated showing the relative locations of the barrier structures on each of the chips that are diced from the substrate wafer. For illustrative purposes, example diced chips are shown with dual and triple barrier structures on this wafer. Typically, each of the chips on a wafer is identically processed and etched, therefore, all of the chips on the wafer would have identical barrier structures situated in the same corresponding on-chip regions. The barrier structures that are used to protect active chip circuit regions from delamination induced by a dicing operation are typically disposed near the chip edge closest to where dicing damage is normally initiated. As shown in FIG. 4, the barrier structures may also be fabricated in an interior region of the chip for protecting circuit areas subjected to other types of mechanical substrate stresses.

There is some distance allowed between the dice line and the crackstop. Some chips may use a guard ring on the outside that sometimes is positively biased to prevent mobile ions from propagating on chip. Cracks originate mostly from dicing mostly but there are many mechanical stressful processes that the wafers are subjected to such as grinding, etc. With SiLK, there appears to be a cleaner dice, but there can still be cracks, especially in any oxide levels. Low-k is typically used in the lower levels, while oxides are usually applied in the upper layers, which is known as a hybrid layer configuration. Cracks typically follow the layer interface laterally (separation). Cracks also propagate vertically, transfer laterally and travel vertically again and in any combination.

Referring to FIG. 7, illustrated is an alternate embodiment for wiring the barrier structures out to bond pads. Compared with the wiring pattern of FIG. 5, the depicted wiring pattern makes contact to a pad by extending one of the lower metal layers of the barrier structures laterally, then upward to the pad on the top surface through use of a vertical via. This wiring embodiment can also be used to electrically couple multiple crackstop and moisture/oxidation barrier structures shown in FIG. 2. This exemplary embodiment wires the uppermost metal layers out to contact pads. The next lower layer for example, may also be used and even deeper layers may also include a lateral metallic extension to provide an appropriate conductive pathway eventually leading up to a contact pad located in a possibly remote region on the uppermost surface of the chip, however, they do not need to terminate on a top surface pad. All that is needed is the availability of electrical I/O to do the measurements. Each column of the barrier structure has a unique I/O associated with it.

Referring to FIG. 8, illustrated is a perspective view of an actual chip edge undergoing separation of chip layers, or delamination, the propagation of which is being attenuated by a polyimide layer on the top surface of the chip. FIG. 9 illustrates a top view of this phenomenon.

FIG. 10 illustrates a perspective view of an actual chip showing the sequential structure of serpentine crackstop, a pair of moisture barriers, followed by a guard ring, as depicted in a top view in FIGS. 1 and 2, (although FIG. 2 does not illustrate a guard ring). FIGS. 11 and 12 illustrate cross section micrographs of dual moisture/oxidation barriers and a crackstop, respectively. The plurality of metal vias through the dielectric layers, and the pyramidal geometry, of the moisture/oxidation barriers is visible in the micrograph of FIG. 11.

It will be appreciated that, although specific embodiments of the invention have been described herein for purposes of illustration, various modifications may be made without departing from the spirit and scope of the invention. Accordingly, the scope of protection of this invention is limited only by the following claims and their equivalents.

We claim:

1. The apparatus comprissing:
    an IC chip having an edge and an active circuit region;
    a first barrier structure and second barrier structure formed across the entire IC chip, each barrier structure comprising multiple electrically conductive layers formed between the edge of the IC chip and the active circuit region; and
    a monitor device coupled to the first and second barrier structures for monitoring electrical properties of the barrier regions which properties indicate integrity status of the barrier regions,
    wherein the barrier structures comprise multiple conductive horizontal layers alternating with horizontal dielectric layers vertically stacked, and wherein the alternating multiple conductive layers are electrically coupled by a via extending through each of the dielectric layers, for preventing a propagation of a crack through the IC chip,
    further comprising a crackstop formed across the entire IC chip comprising multiple electrically conductive layers formed between the edge of the IC chip and the first barrier structure.

2. The apparatus of claim 1, wherein the monitor device is a capacitance meter for monitoring a capacitance magnitude of the barrier regions.

3. The apparatus of claim 1, wherein the monitor device is an ohmmeter for monitoring a resistance magnitude of the barrier regions.

4. The apparatus of claim 1, wherein the alternating multiple conductive layers are electrically coupled by a plurality of vias extending through each of the dielectric layers, for preventing a propagation of contaminants through the IC chip.

5. The apparatus of claim 1, wherein the first barrier structure is parallel to the active circuit region and the second barrier structure.

6. The apparatus of claim 1, wherein the crackstop comprises multiple conductive horizontal layers alternating with horizontal dielectric layers vertically stacked, and wherein the alternating multiple conductive layers are electrically coupled by a via extending through each of the dielectric layers, for preventing a propagation of a crack through the IC chip.

7. An apparatus comprising:
- an IC chip having a circuit region formed therein, the circuit region susceptible to manufacturig stresses that may induce structural defects in the circuit region;
- a pair of first and second electrically conductive barriers barrier structure formed across the entire IC chip at least partially surrounding the circuit region in sequence, each barrier structure comprising multiple electrically conductive layers; and
- a monitor device coupled to the pair of barriers first and second barrier structures for monitoring electrical properties of the barrier regions, which properties indicate integrity status of the barrier regions,
- wherein the first and second barrier structures comprise multiple conductive horizontal layers alternating with horizontal dielectric layers vertically stacked, and wherein the alternating multiple conductive layers are electrically coupled by a via extending through each of the dielectric lavers, for preventing a propagation of a crack from the circuit region;
- further comprising a crackstop formed across the entire IC chip comprising multiple electrically conductive layers formed between the edge of the IC chip and the first barrier structure.

8. The apparatus of claim 7, wherein the monitor device is a capacitance meter for monitoring a capacitance magnitude of the first and second barrier structures.

9. The apparatus of claim 7, wherein the monitor device is an ohmmeter for monitoring a resistance magnitude of the first and second barrier structures.

10. The apparatus of claim 7, wherein the alternating multiple conductive layers are electrically coupled by a plurality of vias extending through each of the dielectric layers, for preventing a propagation of contaminants through the IC chip.

11. An apparatus of claim 7, wherein the first barrier structure is parallel to the active circuit region and the second barrier structure.

12. The apparatus of claim 7, wherein the crackstop comprises multiple conductive horizontal layers alternating with horizontal dielectric layers vertically stacked, and wherein the alternating multiple conductive layers are electrically coupled by a via extending through each of the dielectric layers, for preventing a propagation of a crack through the IC chip.

* * * * *